US006461435B1

United States Patent
Littau et al.

(10) Patent No.: US 6,461,435 B1
(45) Date of Patent: Oct. 8, 2002

(54) SHOWERHEAD WITH REDUCED CONTACT AREA

(75) Inventors: Karl A. Littau, Palo Alto; Bevan Vo, Santa Clara; Salvador P. Umotoy, Antioch; Son N. Trinh, Cupertino; Chien-Teh Kao, Sunnyvale; Ken Kaung Lai, Milpitas; Bo Zheng; Ping Jian, both of San Jose; Siqing Lu, Sunnyvale; Anzhong Chang, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 78 days.

(21) Appl. No.: 09/603,117

(22) Filed: Jun. 22, 2000

(51) Int. Cl.[7] ............................................... C23C 16/00
(52) U.S. Cl. ........................ 118/715; 118/724; 118/725
(58) Field of Search ............................. 118/715, 723 E; 156/345.33, 345.34

(56) References Cited

U.S. PATENT DOCUMENTS

| 5,000,113 A | | 3/1991 | Wang et al. ................. 118/723 |
| 5,273,588 A | * | 12/1993 | Foster et al. .............. 118/723 E |
| 5,449,410 A | * | 9/1995 | Chang et al. .......... 118/723 ER |
| 5,581,874 A | | 12/1996 | Aoki et al. .................... 29/825 |
| 5,866,213 A | | 2/1999 | Foster ......................... 427/573 |
| 5,906,683 A | | 5/1999 | Chen et al. ................. 118/724 |
| 6,019,848 A | | 2/2000 | Frankel et al. .............. 118/715 |
| 6,036,782 A | * | 3/2000 | Tanaka et al. .............. 118/715 |
| 6,051,286 A | * | 4/2000 | Zhao et al. .................. 427/576 |
| 6,079,356 A | * | 6/2000 | Umotoy et al. .......... 118/723 E |
| 6,086,677 A | | 7/2000 | Umotoy et al. ............. 118/715 |
| 6,270,859 B2 | * | 8/2001 | Zhao et al. .................. 427/535 |
| 6,302,964 B1 | * | 10/2001 | Umotoy et al. ............. 118/715 |
| 2001/0016364 A1 | * | 8/2001 | Loan et al. .................... 438/14 |

FOREIGN PATENT DOCUMENTS

JP            401165124 A  *  6/1989  .................. 156/345

* cited by examiner

Primary Examiner—Gregory Mills
Assistant Examiner—Karla Moore
(74) Attorney, Agent, or Firm—Moser Patterson Sheridan LLP

(57) ABSTRACT

A showerhead for distributing gases in a semiconductor process chamber. In one embodiment, a showerhead comprising a perforated center portion, a mounting portion circumscribing the perforated center portion and a plurality of bosses extending from the mounting portion each having a hole disposed therethrough is provided. Another embodiment of the invention provides a showerhead that includes a mounting portion having a first side circumscribing a perforated center portion. A ring extends from the first side of the mounting portion. A plurality of mounting holes are disposed in the mounting portion radially to either side of the ring. The showerhead provides controlled thermal transfer between the showerhead and chamber lid resulting in less deposition on the showerhead.

22 Claims, 3 Drawing Sheets

SHOWERHEAD WITH REDUCED CONTACT AREA

CROSS REFERENCE TO OTHER RELATED APPLICATIONS

This application is related to contemporaneously filed U.S. patent application Ser. No. 09/602,657 (attorney docket No. 4687), which is hereby incorporated by reference in its entirety.

BACKGROUND OF THE DISCLOSURE

1. Field of Invention

The invention relates generally to an apparatus for the distribution of gas within a process chamber.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication processes. One fabrication process frequently used is chemical vapor deposition (CVD).

Chemical vapor deposition is generally employed to deposit a thin film on a substrate or semiconductor wafer. Chemical vapor deposition is generally accomplished by introducing a precursor gas into a vacuum chamber. The precursor gas is typically directed through a showerhead situated near the top of the chamber. The precursor gas reacts to form a layer of material on a surface of the substrate that is positioned on a heated substrate support. Volatile by-products produced during the reaction are pumped from the chamber through an exhaust system.

One material frequently formed on substrates using a chemical vapor deposition process is tungsten. A precursor gas that may be used to form tungsten generally includes tungsten hexafluoride ($WF_6$) and silane. As the silane and tungsten hexafluoride mix, some "stray" tungsten (i.e., tungsten that does not deposit on the substrate) condenses and deposits on the showerhead and other chamber components. Generally, tungsten condenses more rapidly on cooler regions of the chamber. This is particularly problematic at the showerhead.

The showerhead is generally situated between the substrate support and the chamber lid. The substrate support may be heated during processing to between about 300 to about 550 degrees Celsius. The lid is typically water-cooled to maintain the lid at about 45 degrees Celsius. The showerhead generally is heated by the substrate support while being cooled by the lid. As the showerhead is in physical contact with the lid, the cooling effect of the lid conducting heat away from the showerhead maintains the showerhead at a temperature near that of the lid. Thus, the low temperature of the showerhead disadvantageously promotes the deposition of unwanted tungsten on the showerhead. Tungsten formed on the showerhead is a potential source of particulate contamination and must be periodically cleaned, generally by etching using a fluorine-based cleaning process. Eventually, the tungsten build-up may clog the holes in the showerhead preventing passage of the precursor gas therethrough. In this condition, the showerhead must be removed and cleaned or replaced.

Therefore, there is a need for a showerhead that minimizes the formation of deposition thereon in a chemical vapor deposition process.

SUMMARY OF INVENTION

One aspect of the invention generally provides a showerhead for distributing gases in a semiconductor process chamber. In one embodiment, a showerhead comprising a perforated center portion, a mounting portion circumscribing the perforated center portion and a plurality of bosses extending from the mounting portion, each boss having a hole disposed therethrough is provided. Another embodiment of the invention provides a showerhead that includes a mounting portion having a first side circumscribing a perforated center portion. A ring extends from the first side of the mounting portion. A plurality of mounting holes are disposed in the mounting portion radially to either side of the ring.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

The present invention generally provides a processing system and a showerhead that are advantageous for the deposition of tungsten films. The invention is illustratively described below in reference to a chemical vapor deposition system, such as a WxZ™ metal chemical vapor deposition (MCVD) system, available from Applied Materials, Inc., of Santa Clara, Calif. However, it should be understood that the invention has utility when depositing other films and in other system configurations in which dispensing a gas through a showerhead into a chamber is desired.

Figure 1:
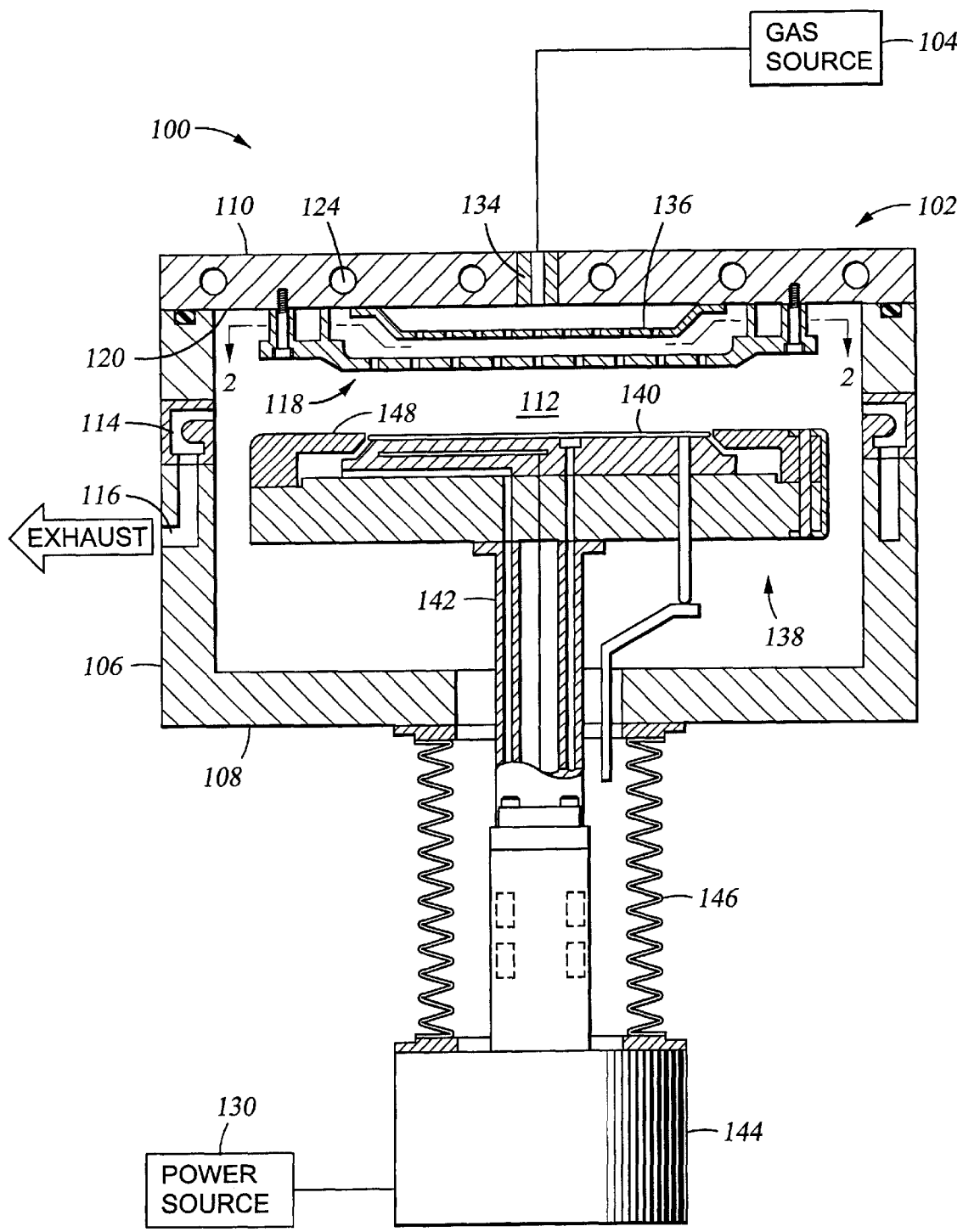
FIG. 1 is a schematic sectional view of a processing chamber depicting one embodiment of a showerhead.

FIG. 1 is a cross sectional view of one embodiment of a chemical vapor deposition system 100. The system generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The walls 106 may contain conduits (not shown) through which a fluid may be passed to control the temperature of the walls 106. The chamber 100 contains a pumping ring 114 that couples the process volume 112 to an exhaust port 116 and other various pumping components not shown.

A heated support assembly 138 is centrally disposed within the chamber 102. The support assembly 138 supports a substrate 140 during processing. The support assembly 138 generally is fabricated from aluminum, ceramic or a combination of aluminum and ceramic and typically includes a vacuum port (not shown) and at least one or more embedded a heating element 132. The vacuum port is used to apply a vacuum between the substrate 140 and substrate support 138, securing the substrate to the substrate support during processing. The heating element 132, such as an electrode disposed in the substrate support 138, is coupled to a power source 130, heating the substrate support 138 and substrate 140 positioned thereon to a predetermined temperature. The process volume 112 is typically accessed through a port (not shown) in the walls 106 that facilitates movement of the substrate 140 into and out of the chamber 102.

Generally, the support assembly 138 is coupled to a stem 142. The stem 142 provides a conduit for electrical leads, vacuum and gas supply lines between the support assembly 138 and other components of the system 100. The stem 142 couples the support assembly 138 to a lift system 144 that moves the support assembly 138 between an elevated position (as shown) and a lowered position. Bellows 146 provides a vacuum seal between the chamber volume 112 and the atmosphere outside the chamber 102 while facilitating the movement of the support assembly 138. Lift pins and the associated mechanisms have been omitted for clarity.

The support assembly 138 additionally supports a circumscribing shadow ring 148. The shadow ring 148 is annular in form and is typically comprised of ceramic, such as aluminum nitride. Generally, the shadow ring 148 prevents deposition at the edge of the substrate 140 and support assembly 138 so that the substrate does not stick to the support assembly 138. Optionally, a purge gas Is supplied between the shadow ring 148 and the support assembly 138 to assist In preventing deposition at the substrate's edge. An example of such a support assembly 138 is disclosed in U.S. patent application Ser. No. 09/596,854, filed Jun. 19, 2000, which is hereby Incorporated by reference in its entirety.

The lid 110 is supported by the walls 106 and can be removed to service the chamber 102. The lid 110 is generally comprised of aluminum and may additionally contain heat transfer fluid channels 124 formed therein. The channels 124 are coupled to a fluid source (not shown) that flows a heat transfer fluid through the lid 110. Fluid flowing through the channels 124 regulates the temperature of the lid 110 typically between about 120 to about 145 degrees Celsius.

A mixing block 134 is disposed in the lid 110. The mixing block 134 is coupled to the gas source 104. Generally, individual gas streams from the gas source 104 are combined in the mixing block 134. These gases are mixed into a single homogeneous gas flow in the mixing block 134 and introduced into the process volume 112 after passing through a showerhead 118 that diffuses the gas flow outwardly towards the chamber walls 106.

The showerhead 118 is generally coupled to an interior side 120 of the lid 110 and defines a plenum 122 therebetween. A perforated blocker plate 136 may optionally be disposed in the plenum 122 between the showerhead 118 and lid 110. Gases (i.e., process and other gases) that enter the chamber 102 through the mixing block 134 are first diffused by the blocker plate 136 as the gases fill the plenum 122 behind the showerhead 118. The gases then pass through the showerhead 118 and into the chamber 102. The plenum 122, blocker plate 136 and showerhead 118 are configured to provide a uniform flow of gases passing through the showerhead 118 into the chamber 102. Such uniformity of gas flow is desirable to promote uniform deposition on the substrate 140.

Figure 2:
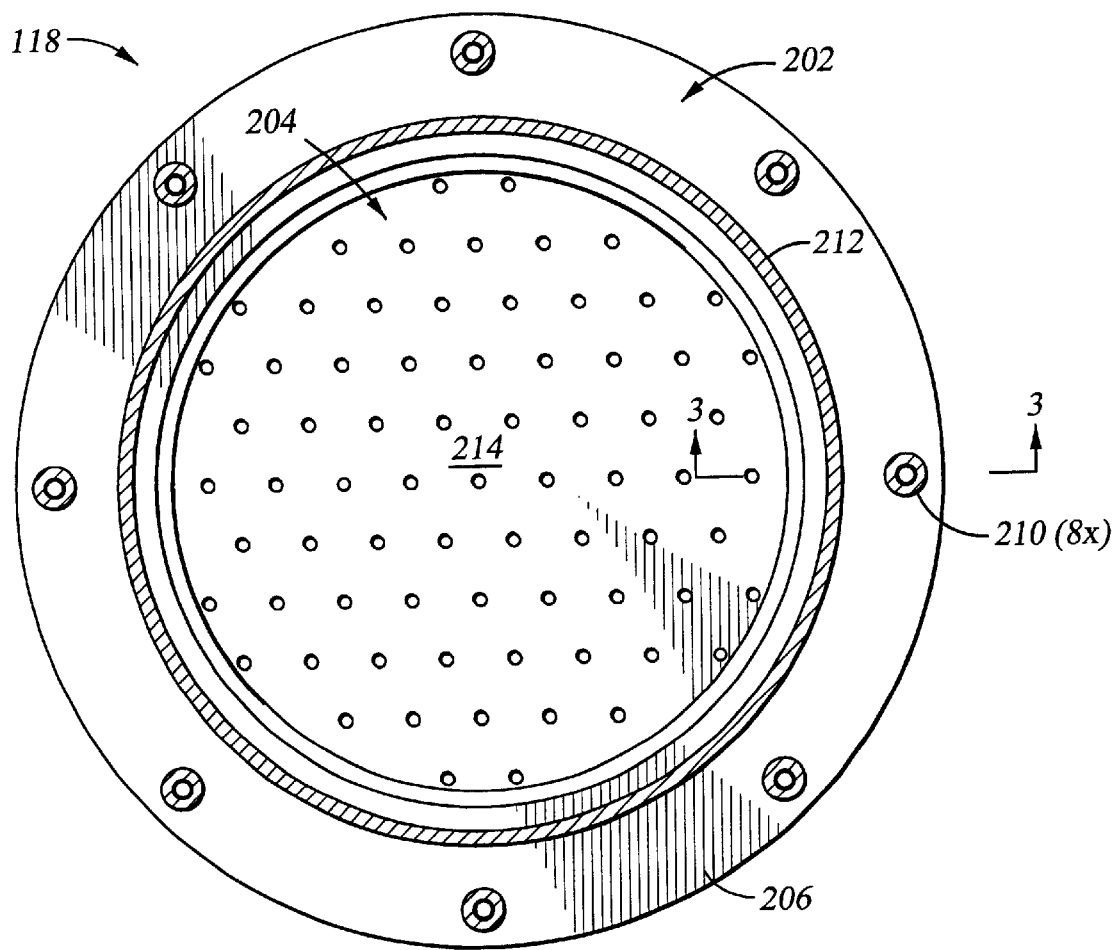
FIG. 2 depicts a cross sectional view of the showerhead taken along section line 2—2 of FIG. 1.

FIG. 2 is a cross sectional view of one embodiment of the showerhead 118. The showerhead 118 is typically fabricated from aluminum. The showerhead 118 may alternatively be fabricated from ceramic for use in corrosive environment applications. The showerhead 118 generally comprises a mounting portion 202 circumscribing a center portion 204. The center portion 204 has a perforated portion 214 that permits fluid (e.g., gas) passage through the showerhead 118. The mounting portion 202 includes a plurality of bosses 210 and a ring 212 extending from a first side 206. Generally, the mounting portion contains at least two or more bosses 210. The ring 212, shown positioned radially inwards of the bosses 210, may be positioned to either side of the bosses 212. Alternatively, the bosses 212 may be positioned on both sides of the ring 212.

Figure 3:
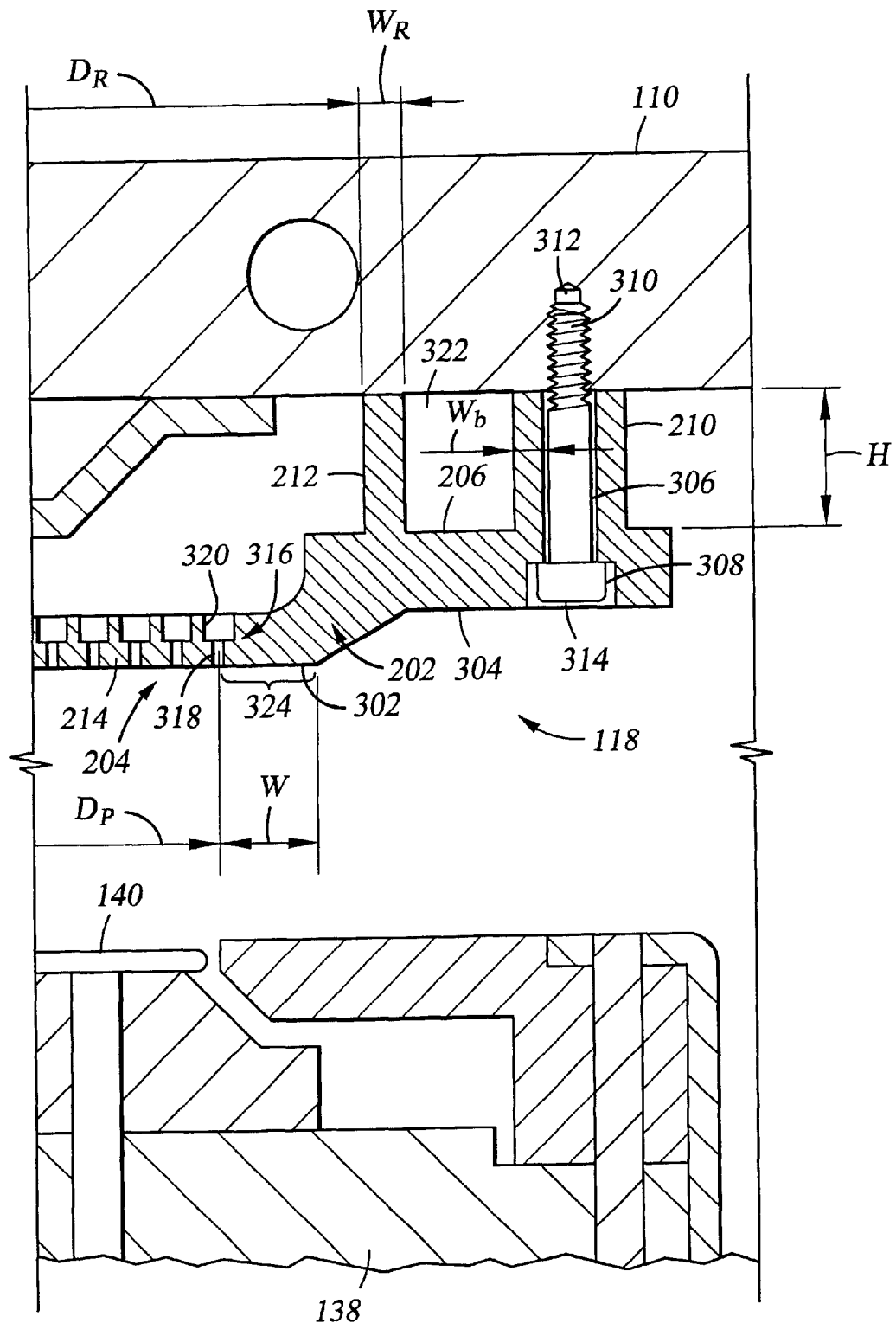
FIG. 3 depicts a cross sectional view of the showerhead taken along section line 3—3 of FIG. 2.

FIG. 3 depicts a portion of the showerhead 118 in cross section. The mounting portion 202 generally includes a second side 302 opposite the first side 206. The second side has a flange 304 disposed at the perimeter of the showerhead 118. The flange 304 is typically recessed below the plane of the first side 206. Alternatively, the flange 304 may be co-planar or extend above the first side 206. The flange 304 contains a plurality of mounting holes 306 passing therethrough. Each hole 306 passes through the flange 304 and passes respectively through one of the bosses 210 disposed on the first side 206 of the showerhead 118. Each hole 306 includes a counter bore 308 disposed on the flange 304. A vented mounting screw 310 passes through the mounting hole 306 and threads into a mating threaded hole 312 in the lid 110. The counter bore 308 accepts a head 314 of the bolt 310 such that the head 314 is positioned flush with or slightly recessed from the flange 304.

The boss 210 and the ring 212 extend from the second side 206 of the showerhead 118 to a height "H" that maintains the second side 206 of the mounting portion 202 at a predetermined distance from the lid 110 (i.e., defining a gap 322). The boss 210 has a wall thickness "$W_b$". The wall thickness $W_b$ is configured to minimize the cross sectional area of the boss 210. In one embodiment, the showerhead 118 includes eight bosses 212 having a wall thickness of about 0.060 inches and a height of 0.250 inches positioned in a spaced-apart relation about the mounting portion 202.

Typically, the bosses 210 are positioned on a bolt circle having a diameter "$D_b$". The diameter $D_b$ positions the mounting holes 306 radially outwards of mounting hole positions found on showerheads used in conventional wafer processing systems. The outward location of the mounting holes 306 minimizes turbulence of the gas passing through the perforated portion 214 by providing a smooth surface 324 immediately outward and co-planar to the perforated portion 214. In one embodiment, the surface 324 has a width "W" of greater than about 0.25 inches, and preferably about 1.25 inches for 200 mm substrate applications. In 300 mm applications, the width "W" should be greater than about 0.45 inches. Generally, prior art systems utilizing mounting holes close to the perforated area do not have widths comparable to the width W provided by the surface 324 that minimizes turbulence of gases flowing through the showerhead (i.e., the heads of the mounting bolts interrupt the adjacent surface and disturb the flow of gases near the outer area's of the perforated portion).

The ring 212 is typically positioned radially inwards of the boss 210. The ring 212 channels the process and other gases exiting the mixing block 134 and blocker plate 136 into the plenum 122 through the perforated portion 214 of the showerhead 118 and into the chamber 102.

The ring 212 has a diameter "$D_r$." The diameter $D_r$ is generally selected to be larger than a diameter "$D_p$" of the perforated portion 214 of the showerhead 118. The ring 212 has a wall thickness "$W_r$". The ring 212 is generally the same height H as the bosses 210. However, the height of the ring 212 may be varied to accommodate variations in surface geometry of either the mounting portion 202 or lid 110. The height H, wall thickness $W_r$ and diameter $D_r$ are typically configured to minimize the cross sectional area of the ring 212.

Generally, the ring 212 has an aspect ratio (i.e., ratio of the height H to wall thickness $W_r$) greater than zero, and preferably greater than about 0.65. Greater aspect ratios reduce thermal transfer between the ring 212 and the lid 110. For example, one embodiment of the ring 212 having a height of about 0.25 inches and a wall thickness of about 0.06 inches and has an aspect ratio of 4.16.

The perforated portion 214 is comprised of a plurality of holes 316 passing through the showerhead 118. Generally, the holes 316 are disposed in a polar array within the diameter $D_p$ that is greater than the diameter of the substrate 140. The holes 316 may alternatively be disposed in other patterns or randomly disposed throughout the perforated portion 214. The holes 316 may optionally include a narrow diameter section 318 and a concentric wider diameter section 320. The narrow diameter section 318 is typically open to the second side 302 of the showerhead 118 while the wider diameter section 320 is typically open to the first side 206. The wider diameter section 320 is utilized to facilitate the fabrication of the showerhead 118 by minimizing the probability of tool breakage during drilling of the narrow diameter section 318. The number of holes 316 and the hole diameters are typically selected to provide flow uniformly of gases passing through the showerhead 118. In one embodiment, the perforated portion 214 comprises about 6200 holes 316.

Various structures and configurations enable temperature control between the showerhead 118 and the lid 110, for example, the gap 322 defined by the spaced-apart relation of the showerhead 118 and lid 110. The gap 322, whose distance may be controlled by the height H of the boss 210 and ring 212, prevents solid to solid (i.e., metal to metal) contact thus minimizing conduction therebetween. For example, the rate of heat transfer between the showerhead 118 and the lid 110 may be decreased by increasing the height H thereby reducing the rate of heat transfer passing across the gap 322. In one embodiment, the height H is 0.25 inches.

Another structure for controlling heat transfer between the showerhead 118 and the lid 110 is provided by the small cross sectional area of the ring 212 and bosses 210. The small cross sectional area (relative the area of the mounting portion 202 that would be in contact with the lid 110 if not for the bosses 210 and ring 212) limits the rate of conduction between the showerhead 118 and the lid 110. For example, the rate of heat transfer between the showerhead 118 and the lid 110 may be decreased by reducing the cross sectional area of the bosses 210 or ring 212, or by increasing the aspect ratio of the ring 212. By way of illustration, the diameter $D_r$, the wall thickness $W_r$, the wall thickness $W_b$ or a combination thereof may be reduced to impede heat transfer between the showerhead 118 and the lid 110. Alternatively, decreasing the number of bosses 210 will decrease the effective total cross sectional area of the bosses 210 thereby reducing heat transfer therethrough without changing the wall thickness $W_b$ of each boss 210. Optionally, both the wall thickness $W_b$ and the number of bosses 210 may be decreased to impede heat transfer between the lid 110 and showerhead 118.

In operation, the semiconductor substrate 140 depicted in FIG. 1 is secured to the support assembly 138 by providing a vacuum therebetween. Gaseous components, which in one embodiment may include silane and tungsten hexafluoride, are supplied from a gas panel to the process chamber through mixing block 134 and showerhead 118 to form a gaseous mixture. The outward position of the mounting holes 306 in the showerhead 118 and the smooth surface 324 adjacent the perforated portion 214 minimizes turbulence within the chamber 102 as the gaseous mixture passes through the showerhead 118, promoting uniform deposition on the substrate 140. The gaseous mixture reacts or decomposes to form a layer of tungsten on the substrate 140. The temperature at the surface of the chamber walls is controlled using liquid-containing conduits that are located in the walls 106 and lid 110 of the system 100.

The temperature of the substrate 140 is controlled primarily by stabilizing the temperature of the support assembly 138. Using thermal control of both the lid 110, walls 106 and the support assembly 138, the substrate 140 is maintained at a temperature of 350 to 550 degrees Celsius.

The temperature of showerhead 118 is maintained at an elevated temperature by minimizing the thermal transfer between the showerhead 118 and the cooled lid 110. The minimized thermal transfer from the showerhead 118 results in the ability to maintain the showerhead 118 at a temperature up to and exceeding about 150 degrees Celsius. The elevated temperature of the showerhead 118 results in less material deposited on the surface of the showerhead 118. Moreover, rate of deposited material clogging the holes 316 through the showerhead 118 is reduced consequently results in 3 to 4 times the number of substrates processed between showerhead cleaning operations.

Although the teachings of the present invention that have been shown and described in detail herein, those skilled in the art can readily devise other varied embodiments that still incorporate the teachings and do not depart from the scope and spirit of the invention.

What is claimed is:

1. A showerhead comprising:
    a perforated center portion;
    a mounting portion circumscribing said perforated center portion and having a first side;
    a plurality of integral bosses extending from said first side of said mounting portion; and
    a mounting hole disposed in each of said bosses.
2. The showerhead of claim 1, wherein the mounting portion is aluminum.
3. The showerhead of claim 1 further comprising:
    a ring disposed on said first side of said mounting portion.
4. The showerhead of claim 1 further comprising:
    a ring disposed on said first side of said mounting portion; said ring radially position to either side of said bosses.
5. The showerhead of claim 1 further comprising:
    a ring disposed on said first side of said mounting portion, said ring having an aspect ratio greater than about 0.65.
6. The showerhead of claim 1, wherein the bosses further comprise:
    eight bosses disposed in a spaced-apart relation on said mounting portion.
7. The showerhead of claim 1 further comprising:
    a ring disposed on said first side of said mounting portion; said ring radially position to either side of said bosses and having an aspect ration greater than about 0.65.
8. The showerhead of claim 1 further comprising:
    a surface co-planar to and circumscribing said perforated portion having a width greater than about 0.25 inches.
9. A showerhead comprising:
    a perforated center portion having a first surface adapted to face a processing region;
    a mounting portion circumscribing said perforated center portion having a first side facing away from the first surface of the perforated center portion;
    a ring extending from said first side of said mounting portion;

a plurality of mounting holes disposed in said mounting portion radially to either side of said ring; and a plurality of integral bosses extending from said first side of said mounting portion.

10. The showerhead of claim 9, wherein each of said mounting holes further comprise:

a boss disposed on said first side of said mounting portion having the mounting hole passing therethrough.

11. The showerhead of claim 9, wherein each of said mounting holes further comprise:

eight mounting holes positioned in a spaced-apart relation.

12. The showerhead of claim 9, wherein the mounting portion is aluminum.

13. The showerhead of claim 9, wherein the bosses are positioned a radially to either side of said ring.

14. The showerhead of claim 9, wherein the ring has an aspect ratio greater than about 0.65.

15. The showerhead of claim 9 further comprising:

a surface co-planar to and circumscribing said perforated portion having a width greater than about 0.25 inches.

16. A semiconductor process chamber comprising:

a processing chamber having a wall and a lid defining an interior volume;

a showerhead coupled to said lid and defining a plenum therebetween, said showerhead having a perforated center portion and a mounting portion circumscribing said perforated center portion;

a ring disposed between said lid and said mounting portion, said ring maintaining said lid and said mounting portion in a spaced-apart relation; and a plurality of integral bosses extending from said first side of said mounting portion.

17. The chamber of claim 16, wherein the showerhead is aluminum.

18. The chamber of claim 16, wherein the plurality of bosses comprise eight bosses disposed in a spaced-apart relation on said mounting portion.

19. The chamber of claim 16 further comprising:

a plurality of bosses disposed on said first side of said mounting portion; said bosses radially position to either side of said ring.

20. The chamber of claim 16, wherein the ring has an aspect ration greater than about 0.65.

21. The chamber of claim 16 further comprising:

a surface co-planar to and circumscribing said perforated portion having a width greater than about 0.25 inches.

22. The chamber of claim 16, wherein the ring is a protuberant extension of the mounting portion.

* * * * *

UNITED STATES PATENT AND TRADEMARK OFFICE
CERTIFICATE OF CORRECTION

PATENT NO. : 6,461,435 B1
DATED : October 8, 2002
INVENTOR(S) : Karl A. Littau et al.

It is certified that error appears in the above-identified patent and that said Letters Patent is hereby corrected as shown below:

Column 1,
Lines 6-7, please change "(attorney docket No. 45687)" to -- , filed June 22, 2002 --.

Column 2,
Line 28, please change "DETAIL" to -- DETAILED --.
Line 58, please delete "a" before "heating".

Column 3,
Line 18, please change "Is" to -- is --.
Line 20, please change "In" to -- in --.
Line 23, please change "Incorporated" to -- incorporated --.

Column 4,
Line 49, please change "area's" to -- areas --.

Column 5,
Line 2, please change "having" to -- has --.

Column 6,
Line 19, please add -- the -- before "rate".
Line 21, please change "results" to -- resulting --.
Line 24, please delete "that".
Lines 44 and 55, please change "position" to -- positioned --.
Line 56, please change "ration" to -- ratio --.

Column 7,
Line 17, please delete "a".

UNITED STATES PATENT AND TRADEMARK OFFICE
CERTIFICATE OF CORRECTION

PATENT NO. : 6,461,435 B1
DATED : October 8, 2002
INVENTOR(S) : Karl A. Littau et al.

It is certified that error appears in the above-identified patent and that said Letters Patent is hereby corrected as shown below:

Column 8,
Line 17, please change "position" to -- positioned --.

Signed and Sealed this

Eighth Day of April, 2003

JAMES E. ROGAN
*Director of the United States Patent and Trademark Office*